(12) United States Patent
Dyer et al.

(10) Patent No.: US 7,101,744 B1
(45) Date of Patent: Sep. 5, 2006

(54) METHOD FOR FORMING SELF-ALIGNED, DUAL SILICON NITRIDE LINER FOR CMOS DEVICES

(75) Inventors: Thomas W. Dyer, Pleasant Valley, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 10/906,670

(22) Filed: Mar. 1, 2005

(51) Int. Cl.
*H01L 21/336* (2006.01)

(52) U.S. Cl. .................... 438/197; 438/199; 438/180; 438/188

(58) Field of Classification Search ................ 438/197
See application file for complete search history.

(56) References Cited

U.S. PATENT DOCUMENTS

| | | | |
|---|---|---|---|
| 4,851,370 A | 7/1989 | Doklan et al. | 437/225 |
| 5,506,169 A | 4/1996 | Guldi | 437/70 |
| 5,538,916 A | 7/1996 | Kuroi et al. | 437/72 |
| 5,580,815 A | 12/1996 | Hsu et al. | 437/69 |
| 5,620,919 A | 4/1997 | Godinho et al. | 438/230 |
| 5,633,202 A | 5/1997 | Brigham et al. | 438/763 |
| 5,633,552 A | 5/1997 | Lee et al. | 310/311 |
| 5,668,403 A | 9/1997 | Kunikiyo | 257/639 |
| 5,707,889 A | 1/1998 | Hsu et al. | 437/69 |
| 5,847,463 A | 12/1998 | Trivedi et al. | 257/751 |
| 5,851,893 A | 12/1998 | Gardner et al. | 438/305 |
| 5,891,798 A | 4/1999 | Doyle et al. | 438/624 |
| 5,908,312 A | 6/1999 | Cheung et al. | 438/287 |
| 5,985,737 A | 11/1999 | Wu | 438/448 |
| 6,040,619 A | 3/2000 | Wang et al. | 257/649 |
| 6,046,494 A | 4/2000 | Brigham et al. | 257/640 |
| 6,146,975 A | 11/2000 | Kuehne et al. | 438/437 |
| 6,214,733 B1 | 4/2001 | Sickmiller | 438/691 |
| 6,228,777 B1 | 5/2001 | Arafa et al. | 438/740 |
| 6,261,924 B1 | 7/2001 | Mandelman et al. | 438/430 |
| 6,306,742 B1 | 10/2001 | Doyle et al. | 438/591 |
| 6,395,610 B1 | 5/2002 | Roy et al. | 438/354 |
| 6,436,848 B1 | 8/2002 | Ramkumar | 438/777 |
| 6,476,462 B1 | 11/2002 | Shimizu et al. | 257/627 |
| 6,509,230 B1 | 1/2003 | Roy et al. | 438/261 |
| 6,515,351 B1 | 2/2003 | Arafa et al. | 257/644 |
| 6,573,172 B1 * | 6/2003 | En et al. | 438/626 |
| 6,724,053 B1 | 4/2004 | Divakaruni et al. | 257/402 |
| 6,825,529 B1 * | 11/2004 | Chidambarrao et al. | 257/336 |

(Continued)

OTHER PUBLICATIONS

T. H. Ning; "Why BICMOS and SOI BICMOS?;" IBM J. Res. & Dev. vol. 46 No. 2/3 Mar./May 2002; pp. 181-186.

(Continued)

*Primary Examiner*—Thao P. Le
(74) *Attorney, Agent, or Firm*—James J. Cioffi; Cantor Colburn LLP

(57) ABSTRACT

A method for forming a self-aligned, dual silicon nitride liner for CMOS devices includes forming a first type nitride layer over a first polarity type device and a second polarity type device, and forming a topographic layer over the first type nitride layer. Portions of the first type nitride layer and the topographic layer over the second polarity type device are patterned and removed. A second type nitride layer is formed over the second polarity type device, and over remaining portions of the topographic layer over the first polarity type device so as to define a vertical pillar of second type nitride material along a sidewall of the topographic layer, the second type nitride layer in contact with a sidewall of the first type nitride layer. The topographic layer is removed and the vertical pillar is removed.

20 Claims, 15 Drawing Sheets

U.S. PATENT DOCUMENTS

2005/0093030 A1* 5/2005 Doris et al. .................. 257/288

OTHER PUBLICATIONS

T. G. Gerence et al., "The Combined Effects of Deuterium Anneals and Deureated Barrier-Nitride Processing on Hot-Electron Degradation in MOSFET's;" IEEE Transactions of Electron Devices, vol. 46, No. 4, Apr. 1999; pp. 747-753.

J. H Stathis; "Reliability limits for the gate insulator in CMOS technology;" IBM J. Res & Dev. vol. 46 No. 2/3 Mar./May 2002; pp. 265-286.

* cited by examiner

METHOD FOR FORMING SELF-ALIGNED, DUAL SILICON NITRIDE LINER FOR CMOS DEVICES

BACKGROUND

The present invention relates generally to semiconductor device processing techniques, and, more particularly, to a method for improving CMOS device performance by forming a self-aligned, dual silicon nitride liner.

Dual liner techniques have been introduced in order to provide different stresses in P-type MOS devices with respect to N-type MOS devices. For example, a nitride liner of a first type is formed over PFETs of a CMOS device, while a nitride liner of a second type is formed over the NFETs of the CMOS device. More specifically, it has been discovered that the application of a compressive stress in a PFET channel improves carrier mobility therein, while the application of a tensile stress in an NFET channel improves carrier mobility therein. Thus, the first type nitride liner over the PFET devices is formed in a manner so as to achieve a compressive stress, while the second type nitride liner over the NFET devices is formed in a manner so as to achieve a tensile stress.

For such CMOS devices employing dual liners, the conventional approach has been to form the two different nitrides using separate lithographic patterning steps. In other words, for example, the first type nitride liner is formed over both PFET and NFET devices, with the portions of the first type nitride liner over the NFET devices being thereafter patterned and removed. After an optional formation of an oxide layer, the second type nitride liner is formed over both regions, with a second patterning step being used to subsequently remove the portions of the second type nitride liner over the PFET devices. Unfortunately, due to inherent inaccuracies associated with aligning lithographic levels to previous levels, the formation of the two liners could result in a gap there between. This would in turn expose the underlying device layer to mobile ion degradation.

On the other hand, the two liners could also be formed in a manner such that one liner overlaps the other. In fact, the reticles used for the two separate patterning steps are typically designed to ensure an overlap such that there is no gap between the two liner materials. However, having certain regions with overlapping nitride liners creates other problems with subsequent processing due to issues such as reliability and layout inefficiencies. For example, a reactive ion etch (RIE) process for subsequent contact formation may have to accommodate for a single-thickness liner in some areas of the circuit, while also accommodating for a double-thickness (overlapping) liner in the interface areas. Moreover, if such overlapping areas are excluded from contact formation, a restriction results in terms of available layout area and critical dimension (CD) tolerances.

Accordingly, it would be desirable to be able to implement the formation of a dual liner CMOS device in a self-aligned manner that does not result in a gap between different liner types and/or an overlap thereof.

SUMMARY

The foregoing discussed drawbacks and deficiencies of the prior art are overcome or alleviated by a method for forming a self-aligned, dual silicon nitride liner for CMOS devices. In an exemplary embodiment, the method includes forming a first type nitride layer over a first polarity type device and a second polarity type device, and forming a topographic layer over the first type nitride layer. Portions of the first type nitride layer and the topographic layer over the second polarity type device are patterned and removed. A second type nitride layer is formed over the second polarity type device, and over remaining portions of the topographic layer over the first polarity type device so as to define a vertical pillar of second type nitride material along a sidewall of the topographic layer, the second type nitride layer in contact with a sidewall of the first type nitride layer. The topographic layer is removed and the vertical pillar is removed.

In another embodiment, a method for forming a self-aligned, dual material liner for semiconductor devices includes forming a first type layer over a substrate and forming a topographic layer over the first type layer. Portions of the first type layer and the topographic layer over a first area of the substrate are patterned and removed. A second type layer is formed over the first area of the substrate, and over remaining portions of the topographic layer over a second area of the substrate so as to define a vertical pillar of first type layer material along a sidewall of the topographic layer, the second type layer in contact with a sidewall of the first type layer. The topographic layer is removed and the vertical pillar is removed.

BRIEF DESCRIPTION OF THE DRAWINGS

Referring to the exemplary drawings wherein like elements are numbered alike in the several Figures.

DETAILED DESCRIPTION

Disclosed herein is a method for improving CMOS device reliability by forming a self-aligned, dual silicon nitride liner. Briefly stated, the embodiments disclosed herein result in the elimination of an overlap region between two types of nitride liner while still maintaining a continuous liner across the device to act as an effective diffusion barrier. The two nitride liners are joined at sharply defined, self-aligned interface therebetween, thus forming a continuous and uniform single nitride layer so as not to complicate subsequent contact etching processes and/or result in additionally restrictive ground rules.

Figure 1:
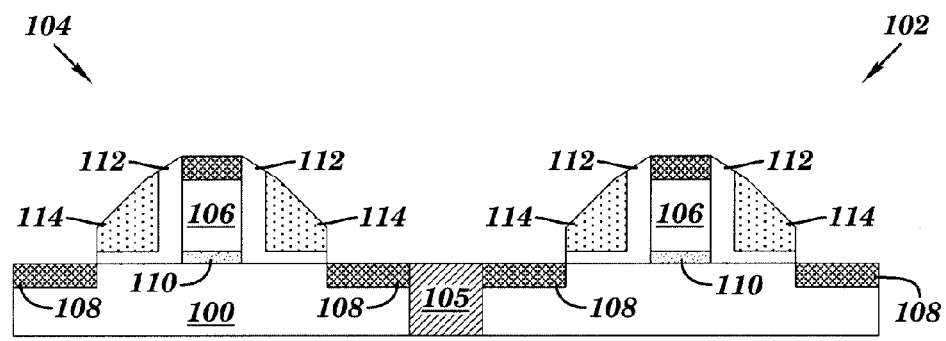
FIG. 1 is a cross sectional view of a semiconductor substrate having a pair of complementary metal oxide semiconductor (CMOS) devices formed thereon, suitable for use in accordance with an embodiment of the invention.

Referring initially to FIG. 1, there is shown a cross sectional view of a semiconductor substrate 100 having a pair of exemplary complementary metal oxide semiconductor (CMOS) devices (i.e., an NFET device 102 and a PFET device 104) formed thereon, and separated from one another by a shallow trench isolation 105. At the particular process stage of device manufacturing shown therein, the silicidation of the gate 106 material (e.g., polysilicon) and source/ drain diffusion regions 108 has taken place, but prior to the formation of the first interlevel dielectric (ILD) layer thereupon. FIG. 1 further illustrates the gate oxide layers 110 (e.g., $SiO_2$) and nitride spacer layers 112, 114 used in the formation of the NFET 102 and PFET 104, as will be recognized by one skilled in the art.

Figure 2A:
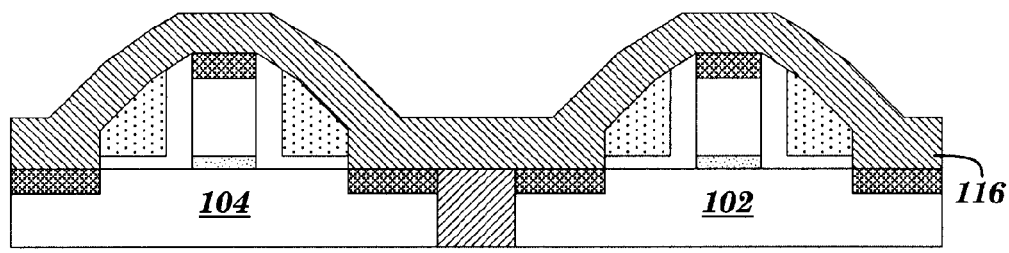
FIGS. 2(a) through 2(h) illustrate an exemplary process flow for forming a self-aligned, dual silicon nitride liner for CMOS devices, in accordance with a first embodiment of the invention.
Figure 2B:
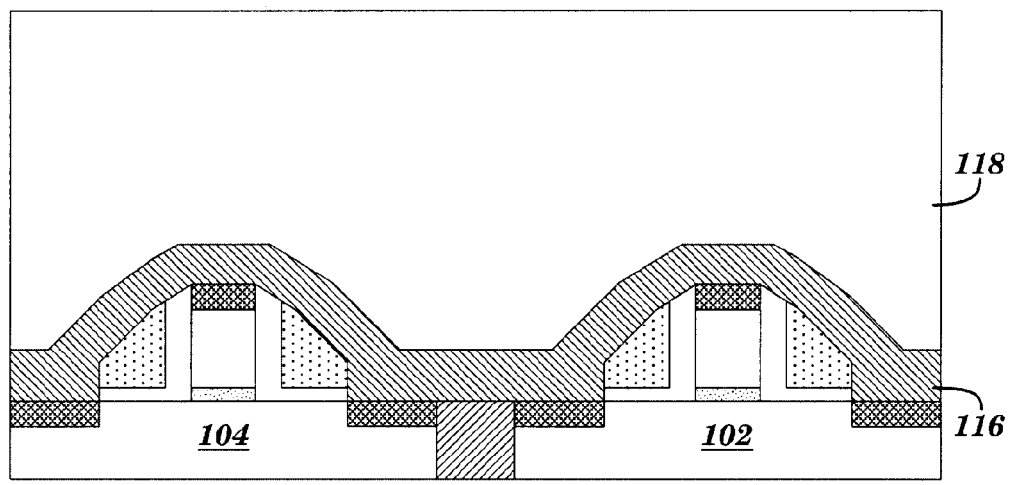

In accordance with a first embodiment, FIGS. 2(a) through 2(h) illustrate an exemplary process flow for forming a self-aligned, dual silicon nitride liner over the silicided NFET 102 and PFET 104 devices. In FIG. 2(a), a tensile silicon nitride layer 116 (e.g., $Si_3N_4$ deposited using a BTBAS (Bis(TertiaryButylAmino)Silane) precursor) is formed over the entire structure, at exemplary thickness of about 1500 angstroms (Å). More generally, the tensile nitride layer 116 is deposited at about slightly more than twice the desired thickness of the final dual nitride liner. Then, in FIG. 2(b), a thick topographic (oxide) layer 118 (or, alternatively, a polysilicon layer) is formed over the tensile nitride layer 116 at an exemplary thickness of about 5000 Å.

Figure 2C:
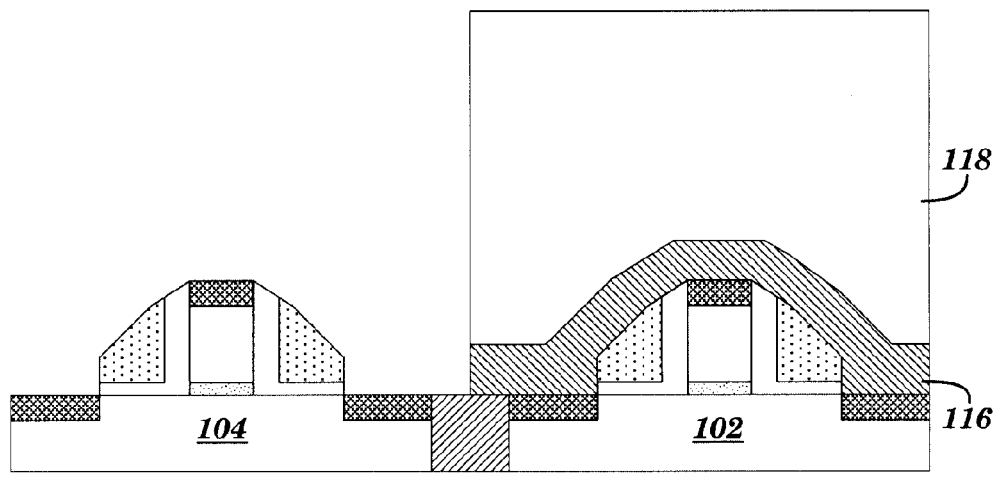

Although the first embodiment utilizes an oxide material for a thick topographical layer, other materials can also be used as shown hereinafter. However, as will be appreciated later, each embodiment utilizes a thick topographic layer that is subsequently patterned so as to create a step height. The oxide layer 118 and underlying tensile nitride layer 116 are then lithographically patterned with a hardened photoresist layer (not shown), wherein the exposed portions of the oxide/nitride stack over the PFET device 104 are removed (e.g., by etching, with the salicided gate and diffusion regions serving as an etch stop) as shown in FIG. 2(c). Unlike previous approaches, only this single initial lithographic step is used in ultimately forming the dual nitride liner.

Figure 2D:
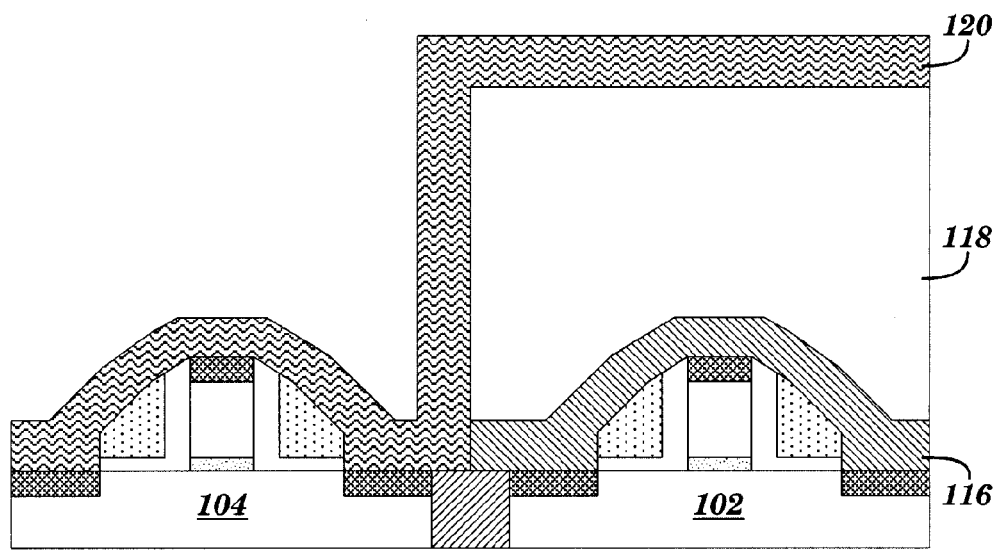
Figure 2E:
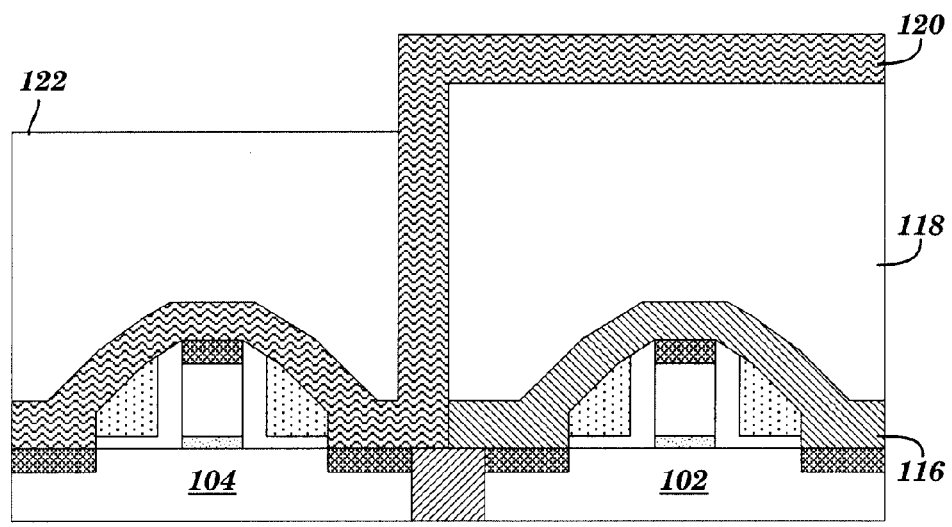
Figure 2F:
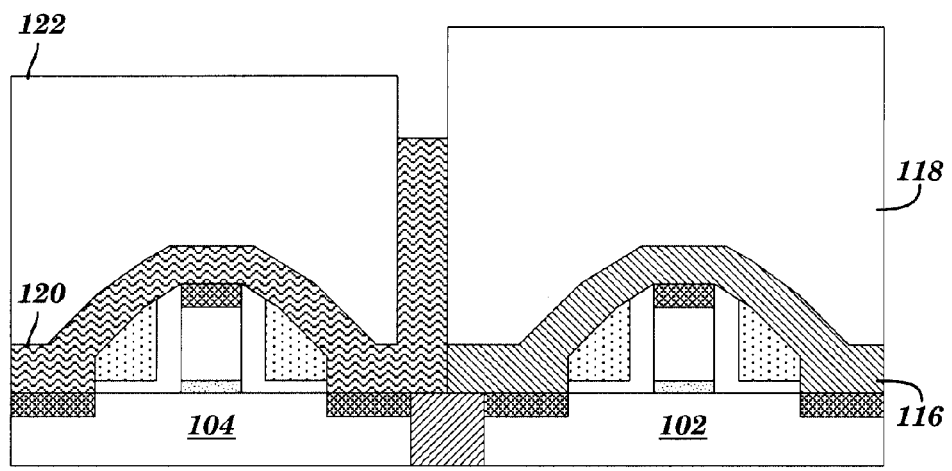

Proceeding to FIG. 2(d), a compressive silicon nitride layer 120 (e.g., $Si_3N_4$ deposited by plasma enhanced chemical vapor deposition (PECVD) using a silane ($SiH_2$) precursor) is then formed over the entire structure, including the remaining portions of the thick oxide layer 118 over the NFET device 102. The compressive nitride layer 120 may also be formed at an exemplary thickness of about 1500 Å (roughly equal to the thickness of the tensile nitride layer 116). Instead of then implementing a second lithographic patterning step, a photoresist layer 122 is applied over the device and recessed to a level below the portion of compressive nitride layer 120 that sits atop the thick oxide layer 118, but still above the level of the portion of compressive nitride layer 120 that sits above PFET device 104. This is shown in FIG. 2(e). Then, in FIG. 2(f), the portion of the compressive nitride layer 120 atop the thick oxide layer 118 is removed with the photoresist layer 122 in place, such as by chemical dry etching (CDE) or RIE, for example.

Figure 2G:
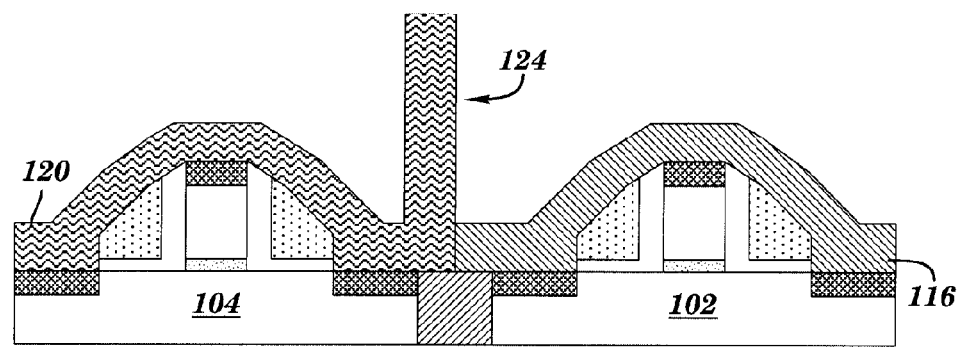
Figure 2H:
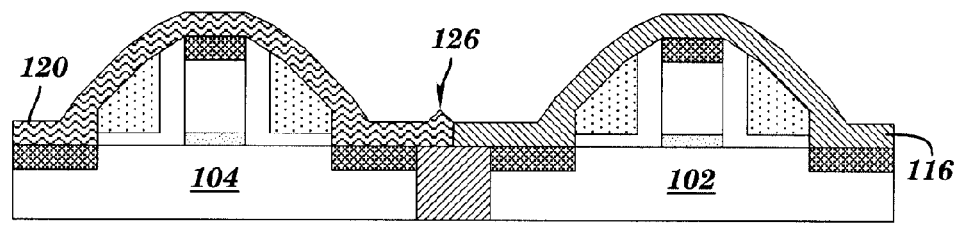

As shown in FIG. 2(g), the resist material 122 is removed from above the PFET device 104. In addition, the thick oxide layer 118 is also removed from above the NFET device 102, such as through a 40:1 buffered HF (BHF) solution, for example. Where a thick polysilicon material is used in lieu of an oxide material, layer 118 may instead be stripped with an ammonium hydroxide solution. In either case, it will be noted that as a result of the compressive nitride etch of FIG. 2(f), a sacrificial vertical pillar 124 of compressive nitride material is defined between the NFET device 102 and PFET device 104. Finally, as shown in FIG. 2(h), the exposed nitride materials (i.e., tensile nitride layer 116 and compressive nitride layer 120) are exposed to a partial anisotropic etch such as HF/EG or CDE, for example.

By targeting this etch to remove a thickness of slightly greater than about half the thickness of the initially deposited tensile and compressive nitride layers (e.g., removing about 800 Å of nitride thickness), this will reduce the final thickness of both the tensile nitride layer 116 and the compressive nitride layer 120 to the desired thickness of the final dual nitride liner (e.g., about 700 Å). Moreover, this partial etch will also serve to remove the majority of the material of the sacrificial vertical pillar 124, as it is subjected to etching on both sides thereof. This results in a sharply defined interface 126 between the tensile nitride layer 116 and the compressive nitride layer 120, without overlapping or gapping, and without the use of a second lithography operation.

Referring generally now to FIGS. 3(a) through 3(j), another exemplary process flow for forming a self-aligned, dual silicon nitride liner for CMOS devices is illustrated, in accordance with a second embodiment of the invention. As is the case with first embodiment, the process flow of the second embodiments begins by forming a tensile silicon nitride layer 302 over the entire structure. Whereas the tensile nitride layer 116 is initially formed in the first embodiment of FIG. 2(a) at exemplary thickness roughly over twice the desired final thickness of the dual nitride liner, the tensile nitride layer 302 of the second embodiment is formed at about the final desired thickness of the dual nitride liner (e.g., about 700 Å).

Figure 3A:
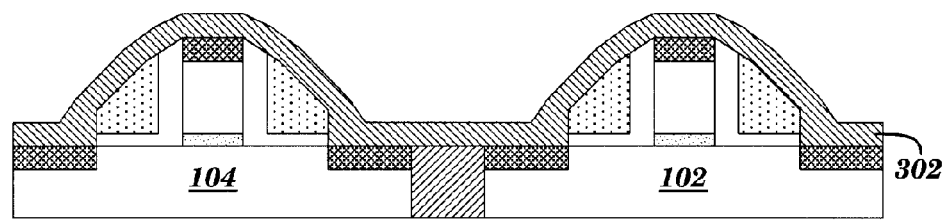
FIGS. 3(a) through 3(j) illustrate an exemplary process flow for forming a self-aligned, dual silicon nitride liner for CMOS devices, in accordance with a second embodiment of the invention.
Figure 3B:
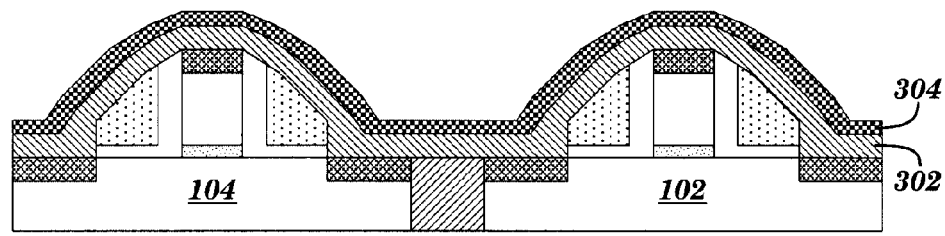
Figure 3C:
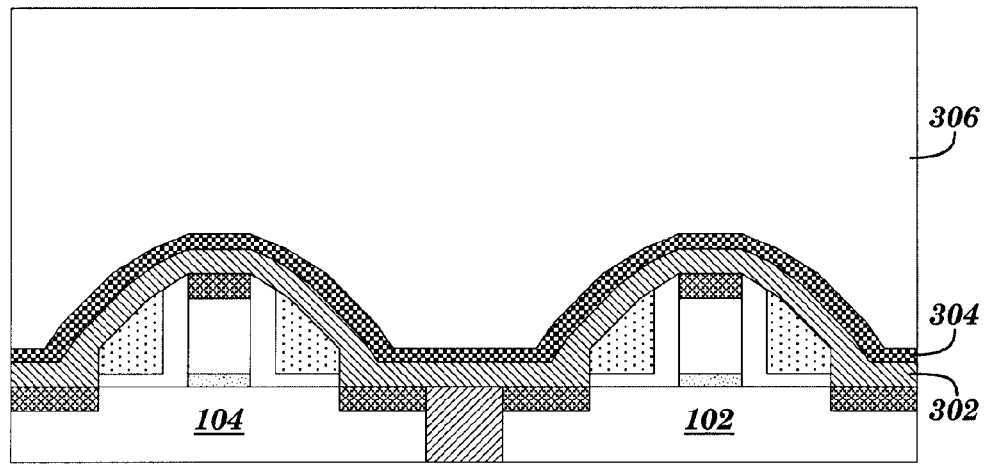
Figure 3D:
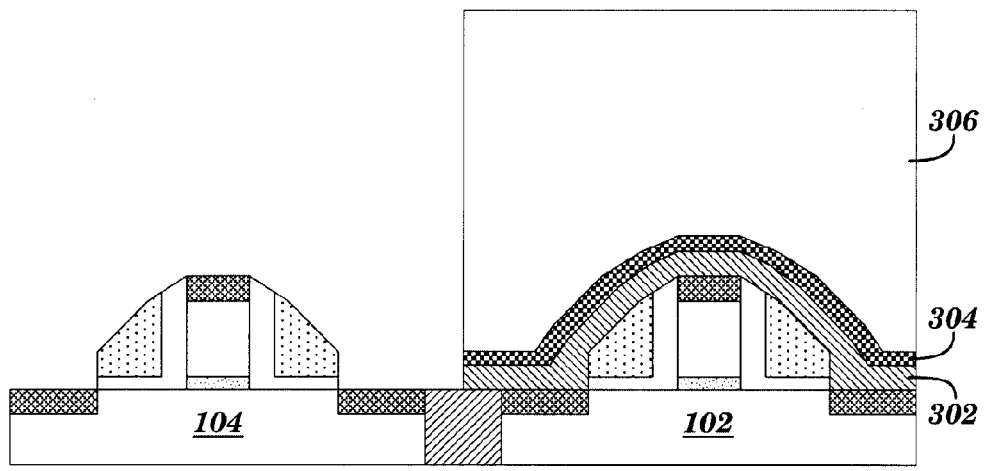

Then, as shown in FIG. 3(b), a thin oxide liner 304 is formed over the tensile nitride layer 302, and will subsequently serve as an etch stop layer. In FIG. 3(c), the thick topographic layer is embodied by a polysilicon layer 306 (e.g., about 3000 Å) formed over the oxide liner 304. A lithographic patterning step is then implemented to remove layers 302, 304 and 306 from the PFET regions of the device (such as by RIE, for example), as shown in FIG. 3(d).

Figure 3E:
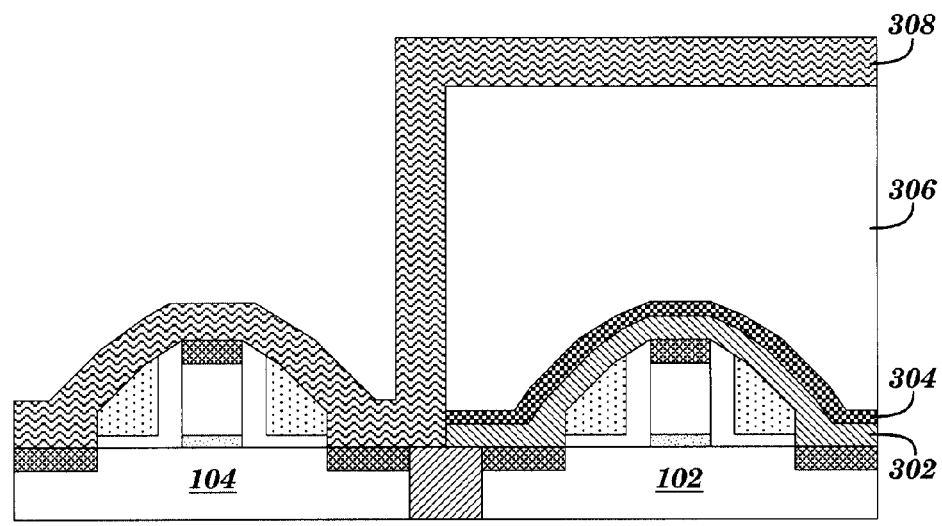
Figure 3F:
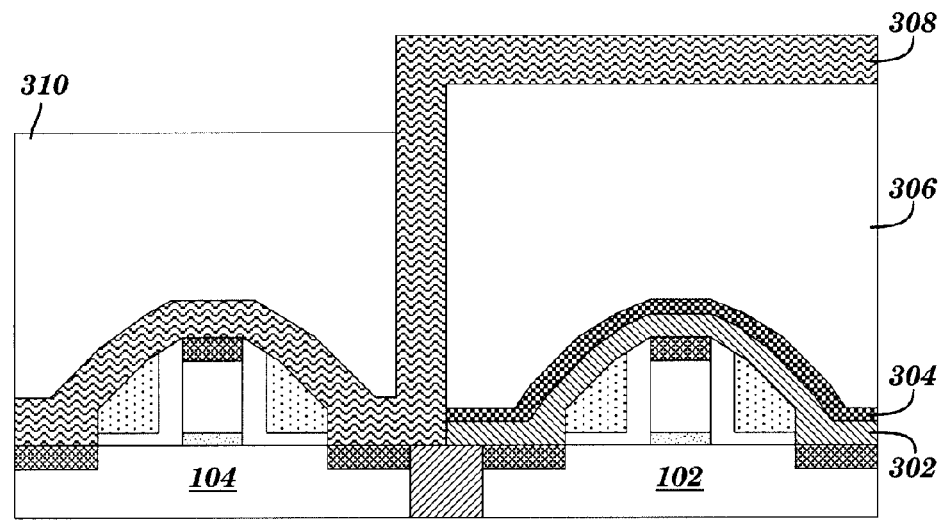

Proceeding to FIG. 3(e), a compressive nitride layer 308 is deposited over the entire structure, including the remaining portions of the thick polysilicon layer 306 over the NFET device 102. In contrast to the tensile nitride layer 302 (but similar to the compressive nitride layer 120 of the first embodiment) the compressive nitride layer 308 is formed at an exemplary thickness of about twice the thickness that the tensile nitride layer 302 (e.g., about 1500 Å). Again, instead of implementing a second lithographic patterning step at this point, a photoresist layer 310 is applied over the device and then recessed to a level below the top the thick polysilicon layer 306, but still above the level of the portion of compressive nitride layer 308 that sits above PFET device 104. This is illustrated in FIG. 3(f).

Figure 3G:
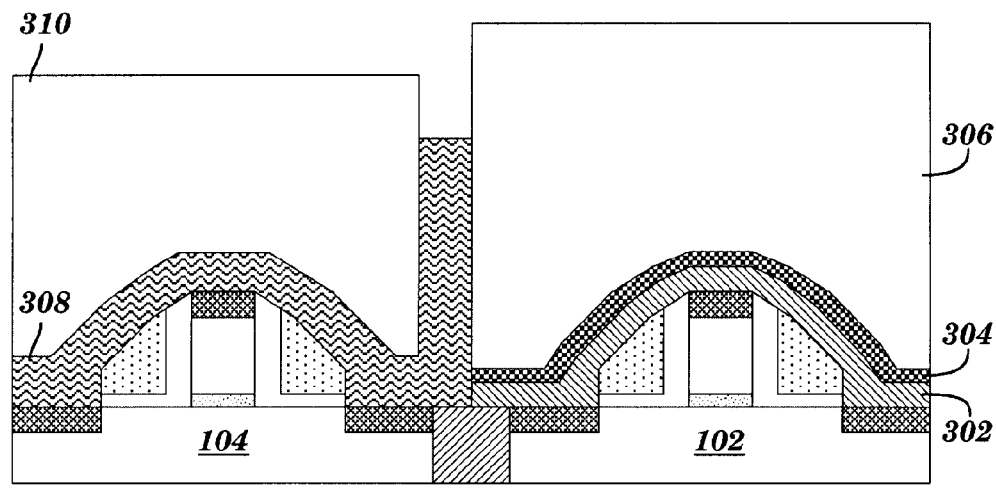
Figure 3H:
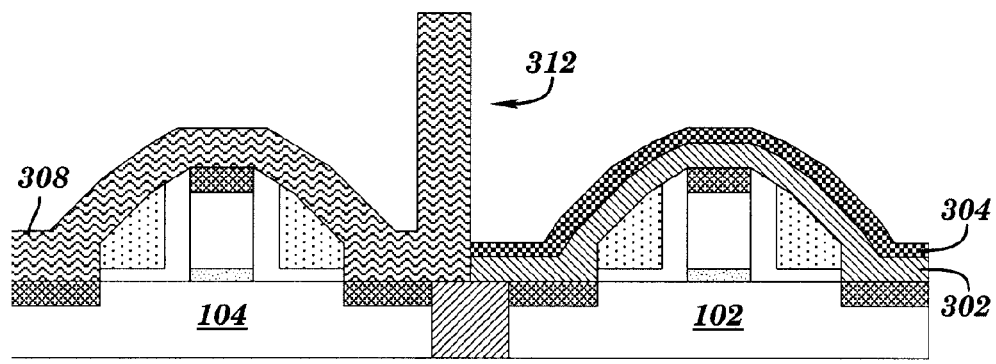
Figure 3I:
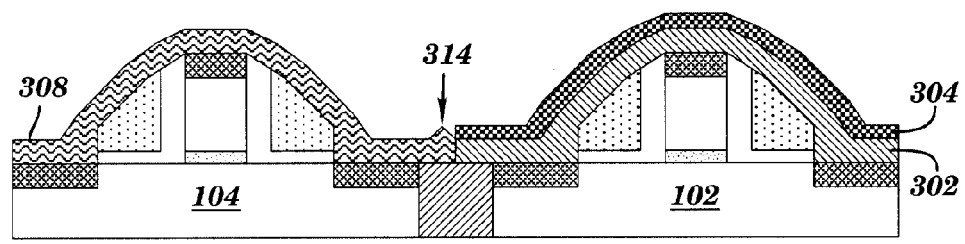
Figure 3J:
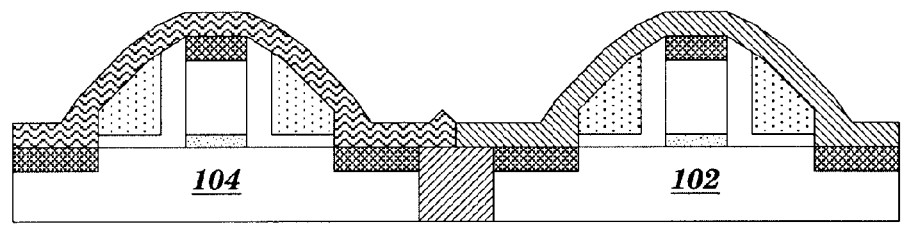

Then, in FIG. 3(g), the portion of the compressive nitride layer 308 atop the thick polysilicon layer 306 is removed with the photoresist layer 310 in place. Upon subsequent removal of polysilicon layer 306 and resist layer 310, a sacrificial vertical pillar 312 of compressive nitride material is defined between the NFET device 102 and PFET device 104, as shown in FIG. 3(h). In FIG. 3(i), the exposed compressive nitride material is then exposed to a partial anisotropic etch (e.g., similar to that described for the first embodiment). As the compressive nitride layer 308 was initially formed at a thickness slightly more that twice that of the tensile nitride layer 302, the etch is thus targeted to remove a thickness of slightly greater than half the thickness of the initially deposited compressive nitride layer. This serves to roughly equalize the thickness of the two nitride layers, as well as to remove the majority of the material of the sacrificial vertical pillar 312, as it is subjected to etching on both sides thereof. Notably, the tensile nitride layer is protected during this etch by the oxide liner 304.

As a result of the partial etch, a sharply defined interface 314 is formed between the tensile nitride layer 302 and the compressive nitride layer 308, without overlapping or gapping, and without the use of a second lithography operation. After the etch is completed, the protective oxide liner 304 is removed to reveal the self aligned dual nitride liner shown in FIG. 3(j), and further processing as known in the art may then proceed.

Figure 4A:
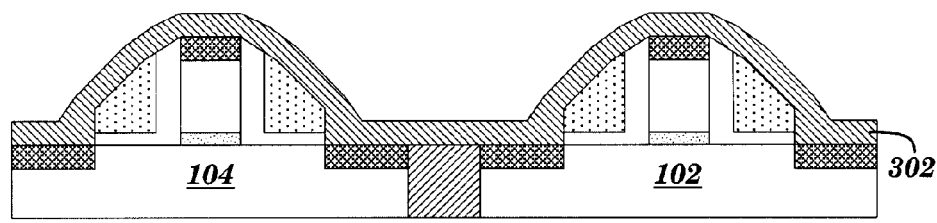
FIGS. 4(a) through 4(j) illustrate an exemplary process flow for forming a self-aligned, dual silicon nitride liner for CMOS devices, in accordance with a third embodiment of the invention.
Figure 4B:
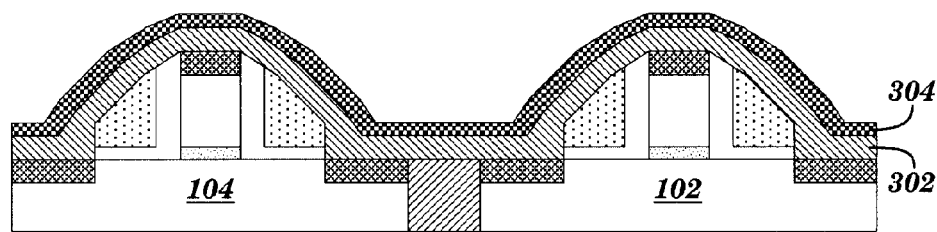
Figure 4C:
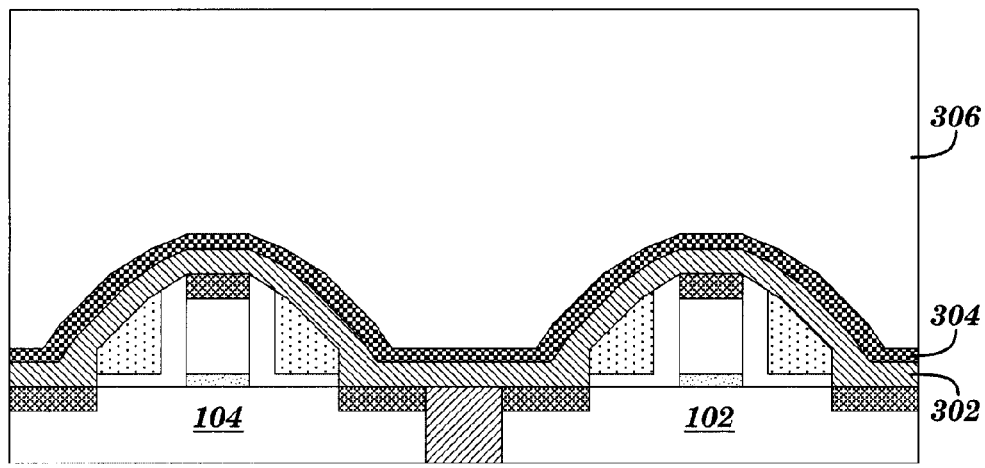
Figure 4D:
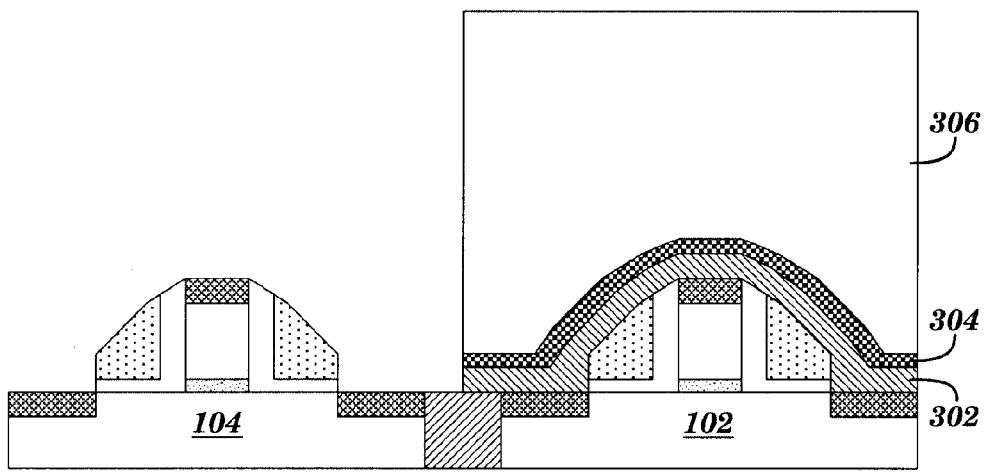
Figure 4E:
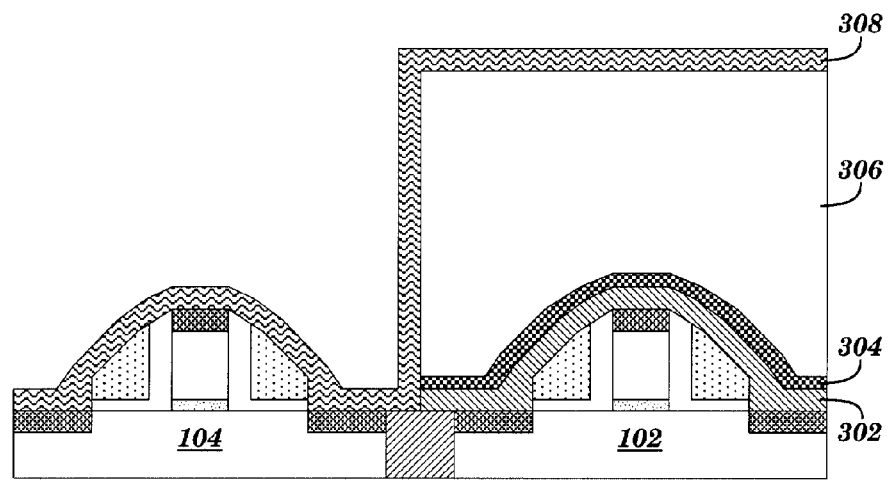

Finally, FIGS. 4(a) through 4(j) illustrate still another exemplary process flow for forming a self-aligned, dual silicon nitride liner for CMOS devices, in accordance with a third embodiment of the invention. In this embodiment, the process flow shown in FIGS. 4(a) through 4(d) is the same as that shown in FIGS. 3(a) through 3(d) and described above, using like reference numerals for purposes of simplicity. In FIG. 4(e), the compressive nitride layer 308 is deposited over the entire structure, including the remaining portions of the thick polysilicon layer 306 over the NFET device 102. In contrast to the second embodiment in FIG. 3(e), the compressive nitride layer 308 of FIG. 4(e) is formed at about the desired final thickness of the dual nitride layer, as is tensile nitride layer 302 (e.g., about 700 Å).

Figure 4F:
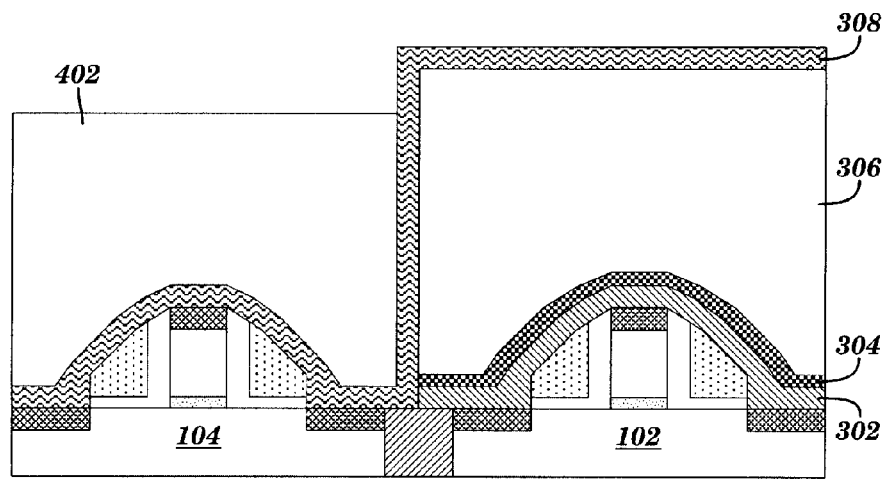
Figure 4G:
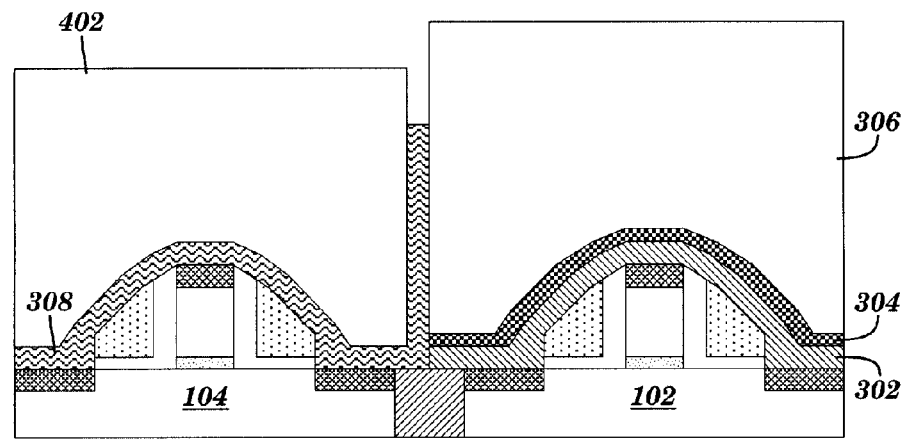
Figure 4H:
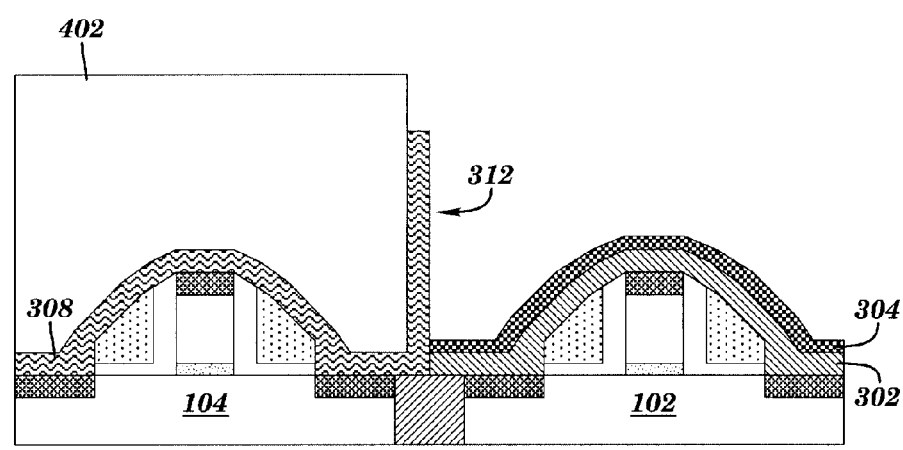

In lieu of a blanket resist material, FIG. 4(f) illustrates the formation of an initial blanket oxide layer 402 (e.g., about 5000 Å in thickness), followed by a recess thereof (e.g., by chemical mechanical planarization or RIE) to a level below the top surface of the polysilicon layer 306. As shown in FIG. 4(g), the portion of the compressive nitride layer 308 atop the thick polysilicon layer 306 is removed with the oxide layer 402 in place. Upon subsequent removal of the polysilicon layer 306 (e.g., by an ammonium hydroxide stripping process selective to both oxide and nitride), a sacrificial vertical pillar 312 of compressive nitride material is defined between the NFET device 102 and PFET device 104, as shown in FIG. 4(h).

Figure 4I:
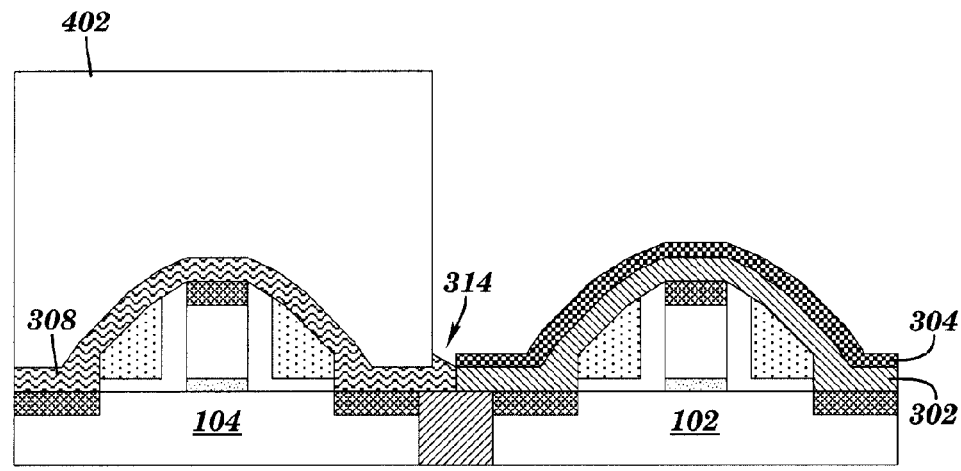
Figure 4J:
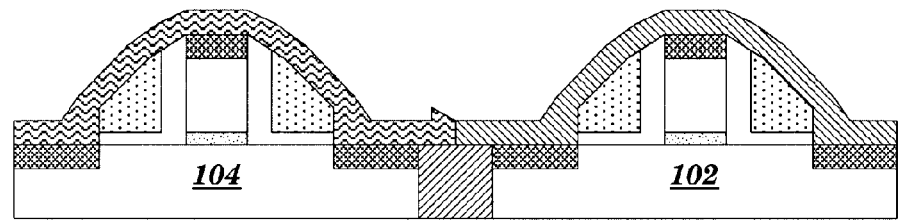

In contrast to the second embodiment, the etching of the pillar 312 is implemented with the oxide layer 402 still in place so as to protect the thickness of the compressive nitride layer 318, as shown in FIG. 4(i). In other words, the pillar material is removed from the sidewall of oxide layer 402, thus resulting in a sharply defined interface 314 formed between the tensile nitride layer 302 and the compressive nitride layer 308, without overlapping or gapping, and without the use of a second lithography operation. It will also be noted at this point, since remaining layers 304 and 402 over the newly formed dual nitride liner are both oxide materials, a first ILD oxide (not shown) may be directly deposited thereupon for the next stage of conventional device processing. Alternatively, layers 402 and 304 could be removed by a process selective to nitride, as shown in FIG. 4(j), before conventional device processing continues.

As will also be appreciated, it is further contemplated that the above described methodology could also be generally applied where it is desired to form a uniform, single layer material from two separate layer materials. Through the use of a topographic layer covering a patterned first type layer, a second type layer may then be formed thereon so as to define a vertical pillar along the patterned sidewall(s) of the topographic layer. Moreover, the second layer abuts the sidewalls(s) of the patterned first layer so as to self-align thereto without a second lithographic patterning step. When the vertical pillar is removed, a sharply defined interface results between the first type and second type layer materials. The initial thickness of the formed first type layer and second type layer will depend on the final desired thickness of the combined single layer, as well as whether there are any protective layer(s) over the first and second type layers during vertical pillar removal.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a self-aligned, dual silicon nitride liner for complementary metal oxide semiconductor (CMOS) devices, the method comprising:
   forming a first type nitride layer over a first polarity type device and a second polarity type device;
   forming a topographic layer over said first type nitride layer, including said first polarity type device and said second polarity type device;
   patterning and removing portions of said first type nitride layer and said topographic layer over said second polarity type device;
   forming a second type nitride layer over said second polarity type device, and over remaining portions of said topographic layer over said first polarity type device so as to define a vertical pillar of second type nitride material along a sidewall of said topographic layer, said second type nitride layer in contact with a sidewall of said first type nitride layer;
   removing said topographic layer; and
   removing said vertical pillar.

2. The method of claim 1, wherein said first type nitride layer is a tensile nitride layer and said second type nitride layer is compressive nitride layer.

3. The method of claim 2, wherein said first polarity type device is an NFET, and said second polarity type device is a PFET.

4. The method of claim 3, wherein said tensile nitride layer and said compressive nitride layer are formed at an initial thickness of about twice a desired final thickness thereof.

5. The method of claim 4, wherein said removing said vertical pillar further causes said initial thickness of said tensile nitride layer and said compressive nitride layer to be reduced to said desired final thickness thereof.

6. The method of claim 5, wherein said topographic layer further comprises one of an oxide layer and a polysilicon layer.

7. The method of claim 6, further comprising:
   applying a photoresist material over said compressive nitride layer;
   recessing said photoresist material to a level below a portion of said compressive nitride layer atop said topographic layer;
   removing said portion of said compressive nitride layer atop said topographic layer; and
   removing said photoresist material and said topographic layer prior to removing said vertical pillar.

8. The method of claim 6, wherein said topographic layer is formed at a thickness of about 5000 angstroms.

9. The method of claim 3, wherein said compressive nitride layer is formed at an initial thickness of about twice a desired final thickness thereof, and said tensile nitride layer is formed at an initial thickness at about a desired final thickness thereof.

10. The method of claim 9, wherein said removing said vertical pillar further causes said initial thickness of said compressive nitride layer to be reduced to said desired final thickness thereof.

11. The method of claim 10, further comprising forming an oxide liner over said tensile nitride material, prior to forming said topographic layer, wherein said patterning also removes portions of said oxide liner over said PFET device.

12. The method of claim 11, wherein said topographic layer further comprises a polysilicon layer.

13. The method of claim 12, further comprising:
applying a photoresist material over said compressive nitride layer;
recessing said photoresist material to a level below a portion of said compressive nitride layer atop said topographic layer;
removing said portion of said compressive nitride layer atop said topographic layer; and
removing said photoresist material and said topographic layer prior to removing said vertical pillar;
wherein said oxide liner material protects said tensile nitride layer during the removal of said vertical pillar and the reduction in thickness of said compressive nitride layer.

14. The method of claim 12, wherein said topographic layer is formed at a thickness of about 3000 angstroms.

15. The method of claim 3, wherein said tensile nitride layer and said compressive nitride layer are formed at an initial thickness of about a desired final thickness thereof.

16. The method of claim 15, further comprising forming an oxide liner over said tensile nitride material, prior to forming said topographic layer, wherein said patterning also removes portions of said oxide liner over said PFET device.

17. The method of claim 16, wherein said topographic layer further comprises a polysilicon layer.

18. The method of claim 17, further comprising:
applying an oxide layer over said compressive nitride layer;
recessing said oxide layer to a level below a portion of said compressive nitride layer atop said topographic layer;
removing said portion of said compressive nitride layer atop said topographic layer; and
removing said topographic layer prior to removing said vertical pillar;
wherein said oxide liner material protects said tensile nitride layer during the removal of said vertical pillar and said oxide layer protects said compressive nitride layer during the removal of said vertical pillar.

19. The method of claim 17, wherein said topographic layer is formed at a thickness of about 3000 angstroms.

20. A method for forming a self-aligned, dual material liner for semiconductor devices, the method comprising:
forming a first type layer over a substrate, said substrate having a first area and a second area;
forming a topographic layer over said first type layer, including said first area and said second area;
patterning and removing portions of said first type layer and said topographic layer over said first area of the substrate;
forming a second type layer over said first area of the substrate, and over remaining portions of said topographic layer over said second area of the substrate so as to define a vertical pillar of second type layer material along a sidewall of said topographic layer, said second type layer in contact with a sidewall of said first type layer;
removing said topographic layer; and
removing said vertical pillar.

* * * * *